(12) United States Patent
Jang et al.

(10) Patent No.: US 7,553,714 B2
(45) Date of Patent: Jun. 30, 2009

(54) METHOD OF MANUFACTURING THIN FILM TRANSISTOR HAVING POLYCRYSTALLINE SILICON LAYER, THIN FILM TRANSISTOR MANUFACTURED USING THE METHOD AND FLAT PANEL DISPLAY COMPRISING THE THIN FILM TRANSISTOR

(75) Inventors: Keun-Ho Jang, Suwon-si (KR);
Hyun-Gue Kim, Suwon-si (KR);
Hong-Ro Lee, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 428 days.

(21) Appl. No.: 11/116,276

(22) Filed: Apr. 28, 2005

(65) Prior Publication Data

US 2005/0242353 A1   Nov. 3, 2005

(30) Foreign Application Priority Data

Apr. 29, 2004   (KR) ............... 10-2004-0030255

(51) Int. Cl.
*H01L 21/84* (2006.01)
*H01L 29/786* (2006.01)

(52) U.S. Cl. ................ 438/166; 438/486; 257/66; 257/72; 257/E29.292

(58) Field of Classification Search ............ 257/66, 257/E29.292; 438/166; 437/164; 210/760
See application file for complete search history.

(56) References Cited

U.S. PATENT DOCUMENTS

| | | | | |
|---|---|---|---|---|
| 5,443,994 | A * | 8/1995 | Solheim ............... | 438/366 |
| 6,348,157 | B1 * | 2/2002 | Ohmi et al. ........... | 210/76 |
| 6,670,638 | B2 * | 12/2003 | Tamura et al. ........ | 257/64 |
| 6,727,122 | B2 * | 4/2004 | Seo et al. ............. | 438/149 |
| 2003/0109086 | A1 * | 6/2003 | Arao .................. | 438/149 0 |

FOREIGN PATENT DOCUMENTS

JP   11-354801   12/1999

(Continued)

OTHER PUBLICATIONS

Yuki, Matsuura et al., Manufacture of Polycrystalline Semiconductor, Dec. 24, 1999, Japanese Publication, Detailed Description: Paragraphs 17-20.*

(Continued)

*Primary Examiner*—Stephen W Smoot
(74) *Attorney, Agent, or Firm*—H. C. Park & Associates, PLC

(57) ABSTRACT

A method for manufacturing a thin film transistor having a more uniform threshold voltage, and a flat panel display device that includes the thin film transistor. The method includes forming an amorphous silicon film on a substrate, removing a silicon oxide layer from a surface of the amorphous silicon film, forming a silicon oxide layer on the surface of the amorphous silicon film, and forming a polycrystalline Si layer by crystallizing the amorphous silicon film.

10 Claims, 1 Drawing Sheet

FOREIGN PATENT DOCUMENTS

| | | | |
|---|---|---|---|
| JP | 11354801 A | * | 12/1999 |
| JP | 2002124467 | | 4/2002 |
| JP | 2002141510 | | 5/2002 |
| JP | 2002368013 | | 12/2002 |
| JP | 2003158135 | | 5/2003 |
| KR | 10-2002-0024514 A | | 3/2002 |
| KR | 10-2002-0092255 A | | 12/2002 |

OTHER PUBLICATIONS

Takashi Yamamoto, "Manufacturing Method of Thin Film Transistor and Manufacturing Method of Display Device Equipped with the Same", English translation of detailed description from JP 2003-158135 A, JPO, May 2003.*

Chinese Office Action dated May 23, 2008.

* cited by examiner

METHOD OF MANUFACTURING THIN FILM TRANSISTOR HAVING POLYCRYSTALLINE SILICON LAYER, THIN FILM TRANSISTOR MANUFACTURED USING THE METHOD AND FLAT PANEL DISPLAY COMPRISING THE THIN FILM TRANSISTOR

CROSS REFERENCE TO RELATED APPLICATION

This application claims priority to and the benefit of Korean Patent Application No. 10-2004-0030255, filed on Apr. 29, 2004, which is hereby incorporated by reference for all purposes as if fully set forth herein.

BACKGROUND OF THE INVENTION

1. Field of the Invention

The present invention relates to a method of manufacturing a thin film transistor (TFT) comprising a polycrystalline silicon (Si) layer, a TFT prepared using the method and a flat panel display device comprising the TFT, and more particularly, to a method for manufacturing a TFT that provides TFTs with a more uniform threshold voltage by controlling the uniformity of a surface of amorphous silicon film before crystallizing the amorphous silicon film.

2. Discussion of the Background

Generally, amorphous silicon may be crystallized at a low temperature to form a polycrystalline Si layer for a TFT's active layer. There are a variety of methods for crystallizing the amorphous silicon film to obtain the polycrystalline Si layer.

A common crystallizing method uses a laser since heat from the laser may not damage a glass, insulating substrate, and this method may form polycrystalline Si that has better characteristics than polycrystalline Si formed using a solid phase crystallizing method. However, when using a laser crystallizing method, a rough oxide layer, which is formed naturally on amorphous silicon film, may deteriorate TFT threshold voltage uniformity.

With the laser crystallizing method, protrusions may be formed on polycrystalline Si layer surfaces where crystallization is delayed due to density differences when the Si changes from a liquid to a solid. These protrusions may be ½ to 2 times as high as the polycrystalline Si layer's thickness.

Consequently, the protrusions may cause defects in a subsequent fabrication process. For example, when sequentially depositing a gate insulating layer and a metal material for a gate electrode on the polycrystalline Si layer, the gate insulating layer and the metal material may be formed with protrusions that are identical to the polycrystalline Si layer's.

Such protrusions in the gate insulating layer may reduce a breakdown voltage and increase a leakage current. Also, the gate insulating layer's protrusions may cause small protrusions in an aluminum gate electrode, thereby deteriorating the TFT's characteristics. Additionally, the protrusions may result in non-uniform etching and exposing, thereby reducing the TFT's reliability.

Japanese Patent Laid-Open publication 1999-354801 discloses a method of forming a polycrystalline Si layer in which, after forming an oxide layer by washing an amorphous silicon film with ozone water, the oxide layer is completely removed by washing with fluoric acid.

However, the polycrystalline Si layer formed using the washed amorphous silicon film according to this method may have a low threshold voltage.

An active matrix organic light emitting display (AMOLED), which is one of many flat panel display devices that uses a TFT, displays images by controlling a current, flowing through an organic electroluminescence (EL) layer, with a gate voltage of a TFT disposed in each pixel. Therefore, it is important that the TFTs have substantially uniform gate voltages and current characteristics. Hence, the TFTs should have substantially uniform threshold voltages. Therefore, a method for providing the amorphous silicon with a substantially uniform surface, in order to improve threshold voltage uniformity, is required.

SUMMARY OF THE INVENTION

The present invention provides a method of manufacturing a TFT that may have a polycrystalline Si layer with a substantially uniform surface roughness obtained by providing an amorphous silicon film with a substantially uniform surface before crystallizing it.

The present invention also provides a TFT that may have a more uniform threshold voltage and a flat panel display device that includes the TFT.

Additional features of the invention will be set forth in the description which follows, and in part will be apparent from the description, or may be learned by practice of the invention.

The present invention discloses a method for manufacturing a TFT, comprising forming an amorphous silicon film on a substrate, removing a first silicon oxide layer from a surface of the amorphous silicon film, forming a second silicon oxide layer on the surface of the amorphous silicon film, and forming a polycrystalline Si layer by crystallizing the amorphous silicon film.

The present invention also discloses TFT manufactured according to the method described above, comprising: an active layer formed by patterning a polycrystalline Si layer, a gate electrode insulated from the active layer, and a source electrode and a drain electrode coupled with the active layer.

The present invention also discloses a flat panel display device comprising a plurality of pixels, wherein a pixel includes the TFT, and a pixel electrode is coupled with the source electrode and the drain electrode of the TFT.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
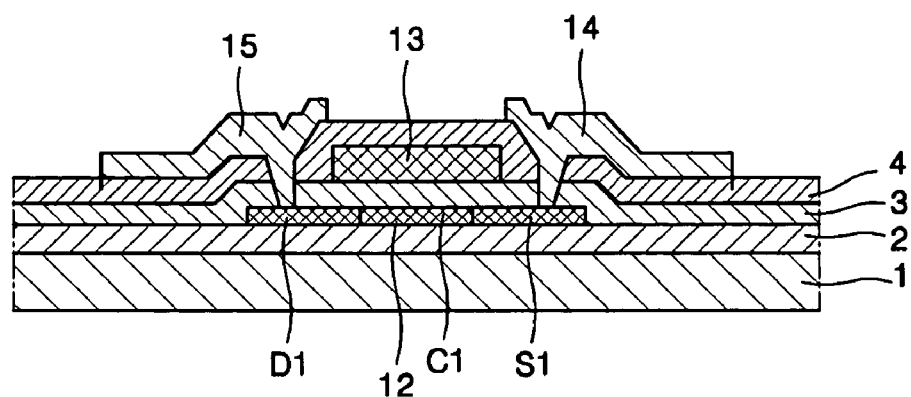
FIG. 1 is a cross-sectional view showing a TFT according to an exemplary embodiment of the present invention.

The present invention will now be described more fully with reference to the accompanying drawings showing exemplary embodiments of the invention.

A method for manufacturing a TFT according to an exemplary embodiment of the present invention includes forming an amorphous silicon film on an insulating substrate. The insulating substrate may be made of glass or other like materials, and an oxide or nitride film may be formed on it. The amorphous silicon film may be formed on the insulating substrate using a chemical vapor deposition process or any other suitable process. When forming the amorphous silicon film, a silicon oxide layer, which is not uniformly thick, may be naturally formed on a surface of the amorphous silicon film. The silicon oxide layer may be approximately 450-550 Å thick.

The amorphous silicon film may then be washed to remove the naturally formed silicon oxide layer. Removal of the layer does not necessarily mean that all traces of the layer are removed.

A process for removing various organic contaminants, which may exist after forming the silicon oxide layer, may be selectively added. The silicon oxide layer may also be effectively removed in this process. Ozone water, or other like substances, may be used to remove the various contaminants that may exist in the silicon oxide layer.

A fluoric acid solution may be used to remove the silicon oxide layer. An appropriate concentration of the fluoric acid solution is about 0.1-0.7 wt %, preferably, about 0.2-0.6 wt %, and more preferably about 0.5 wt %. If the concentration of the fluoric acid solution exceeds about 0.7 wt %, the amorphous silicon film may be etched excessively. On the other hand, if the concentration is less than about 0.1 wt %, the silicon oxide layer may not be removed effectively.

The step of removing the naturally formed silicon oxide layer may be performed for about 80-200 seconds, and preferably, about 100-180 seconds. If the step for removing the silicon oxide layer is performed for more than about 200 seconds, the amorphous silicon film may be etched excessively. On the other hand, if performed for less than about 80 seconds, the silicon oxide layer may not be removed effectively.

After removing the naturally formed silicon oxide layer, a second, substantially uniformly thick, silicon oxide layer may be formed by washing a surface of the amorphous silicon film under a wet oxidation condition.

Ozone water may be used to form the substantially uniformly thick silicon oxide layer.

The concentration of the ozone water used to form the silicon oxide layer may be about 0.0001 to about 5 wt %, and preferably, about 0.001 to about 3 wt %. In particular, about 0.005 wt % is preferable. If the concentration exceeds about 5 wt %, surface characteristics of the subsequently formed polycrystalline Si layer may deteriorate due to excessive formation of the silicon oxide layer. On the other hand, a concentration of less than about 0.0001 wt % may form a non-uniform silicon oxide layer.

The step of forming the substantially uniformly thick silicon oxide layer may be performed for more than about 100 seconds, and preferably, about 120 seconds. If performed for less than about 100 seconds, the silicon oxide layer may not be formed sufficiently.

As described above, a substantially uniform silicon oxide layer may be formed on the surface of the amorphous silicon film after removing the naturally formed silicon oxide layer. When crystallizing with a laser, a substantially uniform silicon oxide layer may control the polycrystalline Si layer's crystal size and surface roughness, thereby forming a polycrystalline Si layer having a substantially uniform surface roughness.

The polycrystalline Si layer may be formed by crystallizing the amorphous silicon film on which the substantially uniform silicon oxide layer is formed. Various methods may be used to crystallize the amorphous silicon film, including methods using a laser, such as an excimer laser annealing (ELA) method.

According to a conventional ELA method, irradiating a pulse laser of a few Hz to tens of KHz to the amorphous silicon film melts the film, and silicon crystals are then formed during cooling. In an exemplary embodiment of the present invention, since the amorphous silicon film having a substantially uniform silicon oxide layer is crystallized, a substantially uniform polycrystalline Si layer may be formed because the substantially uniform silicon oxide layer may control the polycrystalline Si layer's crystal size and surface roughness during crystallization.

The present invention provides a TFT manufactured according to exemplary embodiments of the present invention. The TFT comprises an active layer formed by patterning a polycrystalline Si layer, a gate electrode insulated from the active layer, and source and drain electrodes coupled with the active layer.

FIG. 1 is a cross-sectional view showing a TFT manufactured according to an exemplary embodiment of the present invention.

Referring to FIG. 1, a buffer layer 2 may be formed on an insulating substrate 1, which may be formed of glass or other like materials. For example, the buffer layer 2 may be formed of a silicon oxide or silicon nitride. A gate insulating layer 3 may be formed on the buffer layer 2, and a gate electrode 13 may be formed on a predetermined region of the gate is insulating layer 3. The gate electrode 13 may be formed of a conductive metal, such as MoW, Al, Cr, Al/Cu, or other like materials. A region where the gate electrode 13 is formed corresponds to a channel region C1 of a polycrystalline Si layer 12, which is a semiconductor active layer. An interlayer insulating layer 4 may be formed on the gate electrode 13 and the gate insulating layer 3. A source electrode 14 and a drain electrode 15 may be formed on the interlayer insulating layer 4, and they may be coupled with a source region S1 and a drain region D1, respectively, of the active layer through contact holes in the interlayer insulating layer 4 and the gate insulating layer 3.

The TFT according to an exemplary embodiment of the present invention can be used in a flat panel display device. More specifically, a TFT may be included in each pixel of the flat panel display device, and either the source electrode or the drain electrode of the TFT may be coupled with a pixel electrode. The TFT may also be used as a switching TFT. Any flat panel display device using a TFT may use the TFT of the present invention, including a plasma display panel (PDP), a liquid crystal display (LCD), and an organic light emitting display (OLED). Of the flat panel display devices, the OLED may include a light emitting device comprising a plurality of pixels, and at least one TFT in each pixel. For example, the TFTs may include an active layer comprising a channel region, a source region, and a drain region formed of silicon, a gate insulating layer formed of an insulating material and disposed on the active layer, a gate electrode formed of a conductive material on a region corresponding to the channel region of the active layer, and a gate line coupled with the gate electrode.

Hereinafter, exemplary embodiments of the present invention will now be described with reference to the accompanying drawings. The present invention is not limited to the following embodiments.

EXAMPLE 1

Operation of Forming Amorphous Silicon Film

First, a glass insulating substrate with a silicon oxide film buffer layer was prepared. A 500 Å thick amorphous silicon film was formed on the insulating substrate using a chemical vapor deposition method.

Operation of Removing Silicon Oxide Layer

After treating a surface of the amorphous silicon film with ozone water, the surface was washed with 0.5 wt % fluoric acid solution for 100 seconds using a spin method.

Operation of Forming Silicon Oxide Layer

A silicon oxide layer was then formed on the surface of the amorphous silicon film using a spin method in which 0.005 wt % ozone water was used for 120 seconds.

Operation for Forming a Polycrystalline Si Layer

A polycrystalline Si layer was formed by laser annealing the amorphous silicon film at room temperature and atmospheric pressure. The polycrystalline Si layer formed in this manner is referred to as sample 1.

Comparison A

A polycrystalline Si layer was formed using the same method as in the Example 1, except that the amorphous silicon film was washed using a buffer oxide etchant (BOE) right after being formed. This polycrystalline Si layer is referred to as sample A.

Comparison B

A polycrystalline Si layer was formed using the same method as in the Example 1, except that the step of forming the silicon oxide layer was not performed. This polycrystalline Si layer is referred to as sample B.

Evaluation—Threshold Voltage

Figure 2:
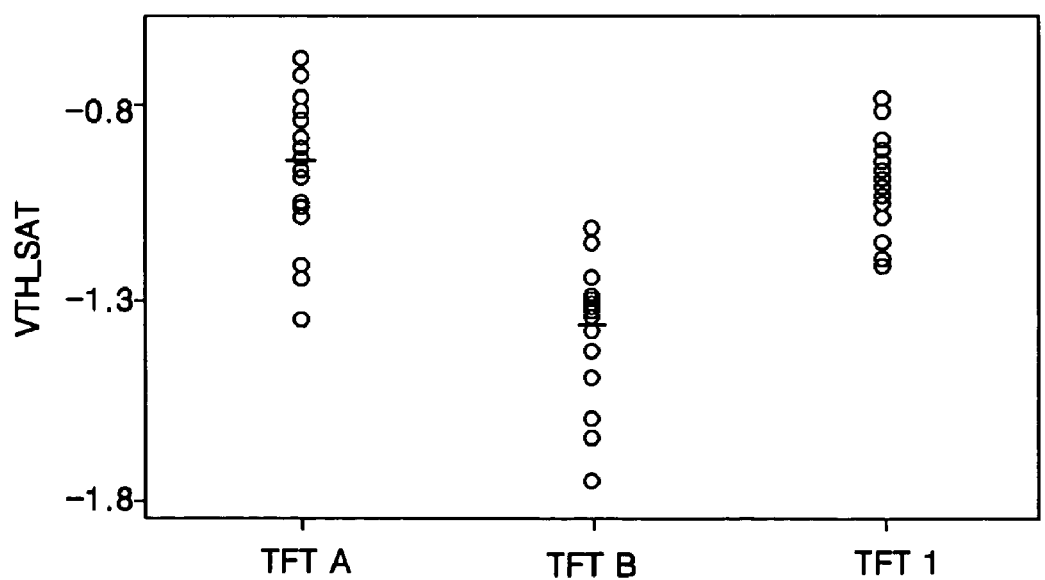
FIG. 2 is a graph showing threshold voltages of TFTs having polycrystalline Si layers formed using different methods.

TFT 1, TFT A, and TFT B were manufactured using samples 1, A, and B, respectively. FIG. 2 shows the TFTs' threshold voltages that were measured using an HP4284 semiconductor analyzer.

Referring to FIG. 2, TFT 1's average threshold voltage was about −1.00V, while 20 TFT A's and TFT B's average threshold voltages were about −0.94V and about −1.36V, respectively. The absolute value of the threshold voltage of the TFT 1 of the present invention is almost the same or less than those of the TFT A and TFT B. The standard deviation of TFT 1's threshold voltage was about 0.13V, which is less than that of TFT A and TFT B, which were 0.19V and 0.17V, respectively. The lower standard deviation of TFT 1's threshold voltage denotes an improvement in threshold voltage uniformity.

According to a method for manufacturing a TFT according to the present invention, a TFT comprising a polycrystalline Si layer having a substantially uniform surface roughness may be obtained by forming the polycrystalline Si layer after removing an irregular silicon oxide layer that is naturally formed on a surface of an amorphous silicon film and then forming a silicon oxide layer having a substantially uniform thickness. TFTs manufactured according to exemplary embodiments of the present invention may provide a flat panel display device with improved reliability since they may have a more uniform threshold voltage.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a thin film transistor, comprising:

forming an amorphous silicon film on a substrate;

removing contaminants on a first silicon oxide layer on a surface of the amorphous silicon film;

removing the first silicon oxide layer from the surface of the amorphous silicon film using a fluoric acid solution after removing contaminants on the first silicon oxide layer;

forming a second silicon oxide layer on the surface of the amorphous silicon film; and forming a polycrystalline silicon layer by crystallizing the amorphous silicon film, wherein the fluoric acid solution has a concentration of about 0.1 wt % to about 0.7 wt %.

2. The method of claim 1, wherein the step of removing the first silicon oxide layer is performed for about 80 seconds to about 200 seconds.

3. The method of claim 1, wherein forming the second silicon oxide layer comprises using ozone water.

4. The method of claim 3, wherein the ozone water has a concentration of about 0.0001 wt % to about 5 wt %.

5. The method of claim 1, wherein the step of forming the second silicon oxide layer is performed for more than about 100 seconds.

6. The method of claim 1, wherein the amorphous silicon film is crystallized using an excimer laser annealing method.

7. The method of claim 1, wherein removing contaminants on the first silicon oxide layer comprises washing the first silicon oxide layer with ozone water.

8. A thin film transistor manufactured according to the method of claim 1, comprising:

an active layer formed by patterning the polycrystalline silicon layer;

a gate electrode insulated from the active layer; and a source electrode and a drain electrode coupled with the active layer.

9. The thin film transistor of claim 8, wherein an absolute value of a PMOS threshold voltage of the thin film transistor is equal to or less than about 1.00V, and a standard deviation of the threshold voltage is less than about 0.13V.

10. A flat panel display device comprising a plurality of pixels, wherein a pixel includes:

the thin film transistor of claim 9, and a pixel electrode coupled with one of the source electrode and the drain electrode of the thin film transistor.

* * * * *